(12) United States Patent
Lecocq et al.

(10) Patent No.: US 9,390,786 B2
(45) Date of Patent: Jul. 12, 2016

(54) METHOD OF MINIMIZING THE OPERATING VOLTAGE OF AN SRAM CELL

(71) Applicants: STMicroelectronics SA, Montrouge (FR); STMicroelectronics International N.V., Amsterdam (NL)

(72) Inventors: Christophe Lecocq, Varces (FR); Kaya Can Akyel, Grenoble (FR); Amit Chhabra, Delhi (IN); Dibya Dipti, Greater Noida (IN)

(73) Assignees: STMicroelectronics SA, Montrouge (FR); STMicroelectronics International N.V., Amsterdam (NL)

(*) Notice: Subject to any disclaimer, the term of this patent is extended or adjusted under 35 U.S.C. 154(b) by 0 days.

(21) Appl. No.: 14/813,278

(22) Filed: Jul. 30, 2015

(65) Prior Publication Data

US 2016/0049189 A1 Feb. 18, 2016

(30) Foreign Application Priority Data

Aug. 13, 2014 (FR) .................................. 14 57800

(51) Int. Cl.
| | | |
|---|---|---|
| G11C 11/34 | (2006.01) | |
| G11C 11/417 | (2006.01) | |
| G11C 11/412 | (2006.01) | |
| H01L 27/11 | (2006.01) | |

(52) U.S. Cl.
CPC ............ *G11C 11/417* (2013.01); *G11C 11/412* (2013.01); *H01L 27/1104* (2013.01)

(58) Field of Classification Search
CPC . G11C 11/417; G11C 11/412; H01L 27/1104
USPC ..................... 365/154, 156, 185.27
See application file for complete search history.

(56) References Cited

U.S. PATENT DOCUMENTS

| | | | | |
|---|---|---|---|---|
| 7,195,959 B1* | 3/2007 | Plummer | ................ | H01L 21/84 257/E21.389 |
| 7,479,418 B2* | 1/2009 | Cai | ................ | H01L 21/84 257/E21.415 |
| 8,415,743 B2* | 4/2013 | Cai | ................ | H01L 27/1203 257/348 |
| 8,525,245 B2* | 9/2013 | Erickson | ................ | H01L 21/84 257/301 |
| 8,552,500 B2* | 10/2013 | Dennard | ................ | H01L 21/84 257/349 |
| 8,598,663 B2* | 12/2013 | Cheng | ................ | H01L 27/1203 257/344 |
| 8,994,085 B2* | 3/2015 | Basker | ................ | H01L 21/84 257/296 |
| 9,112,484 B1* | 8/2015 | Clark | ................ | H03K 3/0315 |
| 2005/0099202 A1* | 5/2005 | Houston | ................ | G01R 31/3004 324/750.03 |
| 2005/0276094 A1 | 12/2005 | Yamaoka et al. | | |
| 2007/0063284 A1 | 3/2007 | Kawahara et al. | | |
| 2008/0158975 A1* | 7/2008 | Sekar | ................ | G11C 7/04 365/185.18 |
| 2008/0175068 A1* | 7/2008 | Houston | ................ | G11C 5/143 365/185.27 |

OTHER PUBLICATIONS

INPI Search Report and Written Opinion for FR 1457800 dated Jun. 24, 2015 (8 pages).
Planes, N., et al: "Process Architecture for Spatial and Temporal Variability Improvement of SRAM Circuits at the 45nm Node," in Solid State Devices and Materials, International Conference on Solid State Devices and Materials, by Japan Society of Applied Physics, 2008, pp. 862-863.

* cited by examiner

*Primary Examiner* — Viet Q Nguyen
(74) *Attorney, Agent, or Firm* — Gardere Wynne Sewell LLP

(57) ABSTRACT

An SRAM cell is formed of FDSOI-type NMOS and PMOS transistors. A doped well extends under the NMOS and PMOS transistors and is separated therefrom by an insulating layer. A bias voltage is applied to the doped well. The applied bias voltage is adjusted according to a state of the memory cell. For example, a temperature of the memory cell is sensed and the bias voltage adjusted as a function of the sensed temperature. The adjustment in the bias voltage is configured so that threshold voltages of the NMOS and PMOS transistors are substantially equal to n and p target threshold voltages, respectively.

18 Claims, 2 Drawing Sheets

US 9,390,786 B2

METHOD OF MINIMIZING THE OPERATING VOLTAGE OF AN SRAM CELL

PRIORITY CLAIM

This application claims the priority benefit of French Patent Application No. 1457800, filed on Aug. 13, 2014, the contents of which is hereby incorporated by reference in its entirety to the maximum extent allowable by law.

TECHNICAL FIELD

The present disclosure relates to a method of minimizing the operating voltage of an SRAM ("Static Random Access Memory") cell formed on FDSOI ("Fully Depleted Silicon On Insulator").

BACKGROUND

FIG. 1 schematically shows a circuit of an SRAM cell. The memory cell comprises two cross-coupled inverters Inv0 and Inv1 in antiparallel, output terminal Out0 of inverter Inv0 being connected to input terminal In1 of inverter Inv1, and output terminal Out1 of inverter In1 being connected to input terminal In0 of inverter Inv0. Inverter Inv0 comprises a P-channel MOS transistor (PMOS) 1 and an N-channel MOS transistor (NMOS) 3 series-connected between a power supply potential Vdd connected to the source of PMOS transistor 1, and a ground potential Gnd connected to the source of NMOS transistor 3. The drains of transistors 1 and 3 are coupled together to output terminal Out0 of inverter Inv0, the gates of transistors 1 and 3 being coupled together to input terminal In0 of inverter Inv0. Inverter Inv1 comprises a PMOS transistor 5 and an NMOS transistor 7 series-connected between potential Vdd connected to the source of PMOS transistor 5, and ground potential Gnd connected to the source of NMOS transistor 7. The drains of transistors 5 and 7 are coupled together to output terminal Out1 of inverter Inv1, the gates of transistors 5 and 7 being coupled together to input terminal In1 of inverter Inv1.

Terminals In0 and Out1 are connected to a bit line 9 via an NMOS transfer transistor 11 and terminals Out0 and In1 are connected to a bit line 13 via an NMOS transfer transistor 15. Thus, a value stored by the memory cell may be written into or read from via bit lines 9 and 13 by applying a control potential Ctrl to the gates of transfer transistors 11 and 15.

In this memory cell, the PMOS transistors of the inverters inv1 and inv0 are all identical and have a same threshold voltage VtP, and the NMOS transistors of the inverters inv1 and inv0 are all identical and have a same threshold voltage VtN.

The electric dynamic power consumption of a circuit comprising an SRAM memory whose memory cells are of the type described in relation with FIG. 1 particularly depends on the square of the power supply voltage of this circuit which is generally limited by the power supply or operating voltage Vdd of its SRAM memory. It would be desirable to provide an SRAM cell having an operating voltage Vdd as low as possible to decrease the power consumption of a circuit comprising an SRAM memory.

SUMMARY

Thus, an embodiment provides a method of minimizing the operation voltage of an SRAM cell formed of FDSOI-type NMOS and PMOS transistors, a doped well extending under an insulating layer of the FDSOI structure, in front of said transistors, a bias voltage being applied to the well, the method comprising adjusting the bias voltage according to the state of the memory cell.

According to an embodiment, the memory cell is an element of an array of identical memory cells, the doped well being shared in common to all the memory cells in the array.

According to an embodiment, the method comprises the successive steps of: carrying out measurements representative of the threshold voltage of the PMOS transistors and of the threshold voltage of the PMOS transistors; and adjusting the bias voltage of the well so that the threshold voltage of the NMOS transistors and of the PMOS transistors are substantially equal (i.e., to within a margin of 10%) to target threshold voltages of the NMOS and PMOS transistors respectively.

According to an embodiment, the target threshold voltages of NMOS and PMOS transistors are equal.

According to an embodiment, the method further comprises the successive steps of: measuring the operating temperature of the memory cell; and controlling the bias voltage with difference between the operating temperature and a reference temperature to correct the increase of the operating voltage resulting from a variation of said difference.

According to an embodiment, the well is P-type doped and the bias voltage is increased when the operating temperature decreases, and the bias voltage is decreased when the operating temperature increases.

According to an embodiment, the measurement representative of the threshold voltages is a measurement of a frequency of an oscillator formed of a chain of inverters.

According to another aspect, an embodiment provides an integrated circuit chip comprising: an SRAM cell formed of FDSOI-type NMOS and PMOS transistors; a doped well extending under an insulating layer of the FDSOI structure, in front of said transistors; a device for measuring the operating temperature of the memory cell; and a device for controlling the bias voltage of the well according to the operating temperature.

According to an embodiment, the memory cell is an element of an array of identical memory cells, the doped well being shared in common to all the memory cells in the array.

BRIEF DESCRIPTION OF THE DRAWINGS

The foregoing and other features and advantages will be discussed in detail in the following non-limiting description of specific embodiments in connection with the accompanying drawings.

DETAILED DESCRIPTION

In a memory cell of the type described in relation with FIG. 1, there exists a limiting value $Vdd_R$ of operating voltage Vdd below which errors may occur during read operations. Similarly, there exists a limiting value $Vdd_W$ of operating voltage Vdd below which errors may occur during write operations.

For the memory cell to operate without errors, operating voltage Vdd should be selected to be greater than or equal to a critical operating voltage $Vdd_{CR}$ which should be greater than limiting values $Vdd_R$ and $Vdd_W$. To decrease the power consumption of a memory cell, operating voltage Vdd is selected to be equal to or substantially greater than the critical operating voltage $Vdd_{CR}$.

As described in relation with FIG. 11 of article "Process Architecture for Spatial and Temporal Variability Improvement of SRAM Circuits at the 45 nm node" of N. Planes et al., disclosed in 2008 at the SSDM Conference (incorporated by reference), the fact of bringing as close as possible to each other the absolute values of threshold voltages VtP of the PMOS transistors and VtN of the NMOS transistors results in low values of critical operating voltage $Vdd_{CR}$.

Figure 1:
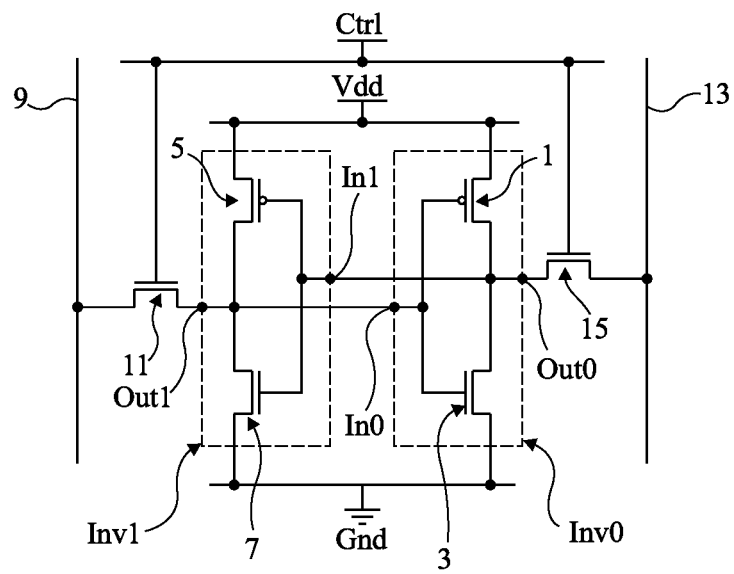
FIG. 1, previously described, shows a simplified circuit of an SRAM cell.
Figure 2:
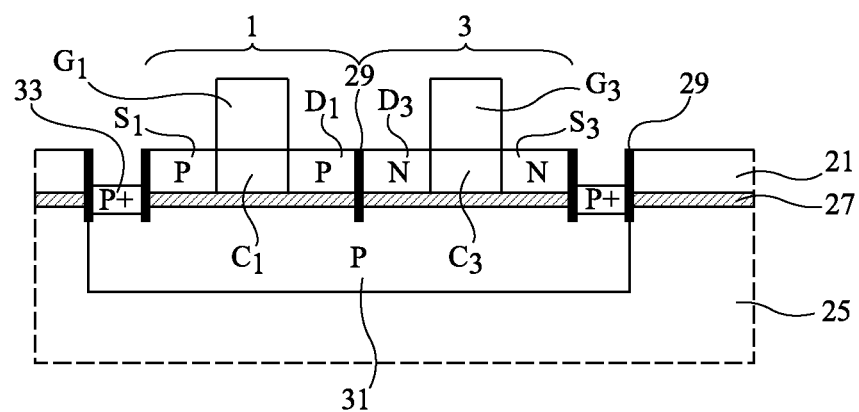
FIG. 2 is a simplified cross-section view showing an embodiment on FDSOI of elements of the memory cell of FIG. 1; as usual in the representation of semiconductor components, this drawing is not to scale.

FIG. 2 partially and schematically shows an embodiment on FDSOI (fully-depleted, silicon on insulator) of transistors of a memory cell of the type in FIG. 1. Only NMOS transistor 1 and PMOS transistor 3 of the memory cell of FIG. 1 are shown in FIG. 2.

PMOS transistor 1 comprises, in a thin silicon layer 21, P-type doped source and drain regions S1 and D1 separated from each other by a channel-forming region C1. An insulated gate stack G1 is formed above channel-forming region C1. NMOS transistor 3 comprises, in thin silicon layer 21, N-type doped source and drain regions S3 and D3 separated from each other by a channel-forming region C3. An insulated gate stack G3 is formed above channel-forming region C3.

Silicon layer 21 is separated from a silicon support 25 by an insulating layer 27. The memory cell transistors are insulated from one another by insulating trenches 29 crossing silicon layer 21 all the way to insulating layer 27. Under the memory cell transistors, the support comprises a P-type doped well 31, insulating layer 27 separating well 31 from silicon layer 21.

Heavily-doped P-type silicon regions 33 ($P^+$) contact well 31. Regions 33 are insulated from thin layer 21 by insulating trenches 29. Thus, well 31 may be biased to a bias potential Vpol via connections connected to regions 33.

All the memory cell transistors are formed above the same well 31. In an SRAM comprising an array of memory cells, well 31 is shared in common to all memory cells. This type of memory cell and this type of memory will be called hereafter: "single-well memory cell" and "single-well memory".

Beyond the surface occupied by the memory transistors, other transistors, for example, logic circuit transistors, may be formed inside and on top of thin layer 21, and these transistors can then be arranged above wells different from the well common to the SRAM transistors.

Figure 3:
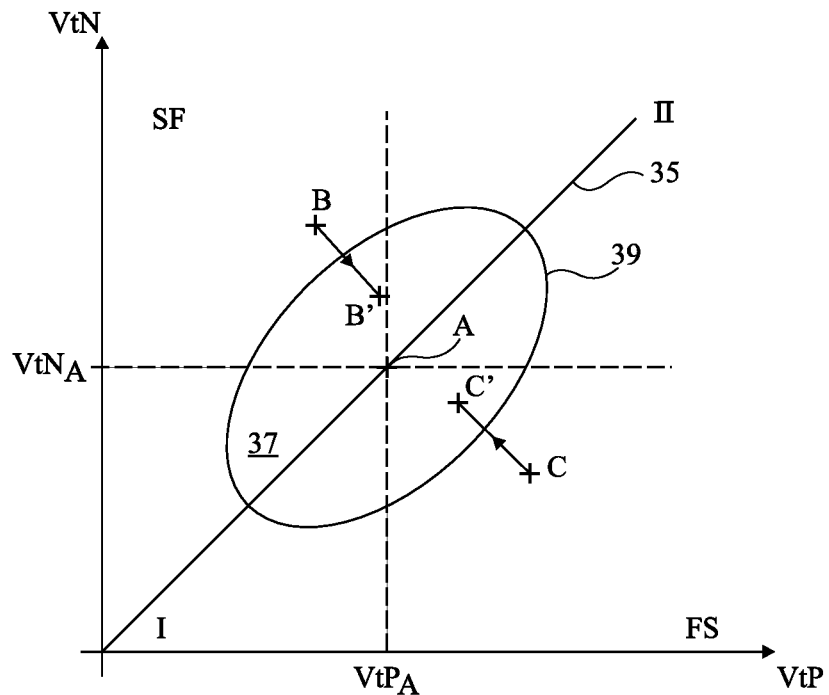
FIG. 3 is a diagram indicating the critical operating voltage of an SRAM cell according to the threshold voltages of the transistors forming this memory cell.

FIG. 3 is a diagram indicating, for a single-well memory cell, the value of critical operating voltage $Vdd_{CR}$ according to threshold voltages VtP and VtN of the transistors forming this memory cell. The absolute values of voltage VtP (in abscissas) and of voltage VtN (in ordinates) are indicated along an arbitrary linear scale.

On design of a memory cell, to obtain a critical operating voltage $Vdd_{CR}$, and thus a power consumption, as low as possible, it is aimed at obtaining equal threshold voltages VtP and VtN for the P-channel and N-channel transistors. In other words, it is aimed at obtaining an operating point on a straight line 35 of FIG. 3 corresponding to the case where the absolute values of threshold voltages VtP and VtN are equal. For example, in the context of a given technology, it is desired to obtain target values $VtP_A$ and $VtN_A$ of these threshold voltages, corresponding to a point A of the diagram of FIG. 3 for which the critical operating voltage is equal to $Vdd_A$. The diagram of FIG. 3 can thus be divided into four quadrants defined by horizontal and vertical lines running through point A.

In a quadrant I, also named quadrant FF ("Fast-Fast") in the art, the values of VtP and VtN are smaller than $VtP_A$ and $VtN_A$. If values VtP and VtN become too low, the transistors will significantly leak.

In a quadrant II, also named quadrant SS ("Slow-Slow") in the art, the values of VtP and VtN are greater than values $VtP_A$ and $VtN_A$. As a result, the operating voltages of the memory cells of quadrant II should be greater than $Vdd_A$.

In a quadrant SF, the values of VtP are smaller than $VtP_A$ and the values of VtN are greater than $VtN_A$. As a result, the memory cells risk exhibiting write errors if their operating voltages are not greater than $Vdd_A$.

In a quadrant FS, the values of VtP are greater than $VtP_A$ and the values of VtN are smaller than $VtN_A$. As a result, the memory cells risk exhibiting read errors if their operating voltages are not greater than $Vdd_A$.

Of course, in the practical forming of an SRAM containing elementary transistors, due to manufacturing dispersions, it is impossible to exactly be in the conditions corresponding to point A ($VtP_A$, $VtN_A$, $Vdd_A$). A tolerance area 37 is defined within a closed curve 39 where the corresponding memory points can still operate at a voltage substantially equal to $Vdd_A$. In a direction orthogonal to that of straight line 35, this tolerance area substantially corresponds to memory cells for which the threshold voltage VtP is equal to $VtP_A$ to within 10%, and the threshold voltage VtN is equal to $VtN_A$ to within 10%.

If the manufactured circuit is such that its operating point is located outside of tolerance area 37 in a direction orthogonal to that of straight line 35, it is here provided, in the case where the SRAM is a single-well memory, to modify bias voltage Vpol of the well to take the operating point back inside of tolerance area 37. More specifically, to take an operating point B located outside of tolerance area 37 on the side of quadrant SF back towards a point B' located inside of this area, bias voltage Vpol of the well is increased, and to take a point C located outside of tolerance area 37 on the side of quadrant FS back towards a point C' located inside of this area, bias voltage Vpol of the well is decreased.

The fact for an operating point to be outside of tolerance area 37 may result from many reasons.

A first reason is that, as previously indicated, there inevitably are manufacturing dispersions. In this case, the bias voltage correction is determined after initial tests during which values VtP and VtN are directly or indirectly measured to determine in which quadrant, more particularly quadrant SF or quadrant FS, the operating point is located. After these initial tests, bias voltage Vpol is modified as indicated previously. The values of threshold voltages VtP and VtN are for example deduced from the measurement of the frequency of an oscillator formed of a chain of inverters having transistors identical to those of the memory cells, and formed above the same well 31 common to the transistors of these memory cells.

A second reason is that there are parameter variations during the operation of a memory cell, for example, temperature variations inevitably appear. In this last case, to perform the corresponding correction, it is provided to insert into the integrated circuit chip containing the SRAM cell a temperature sensor and bias voltage Vpol will be temperature-controlled. More specifically, for an operating point C' situated in the tolerance area 37 and in the quadrant FS, a temperature increase results in a displacement of the operating point towards the point C into the quadrant FS. Bias voltage Vpol is then decreased to take the operating point back into tolerance area 37. Conversely, for an operating point B' situated in the tolerance area 37 and in the quadrant SF, a temperature decrease causes the operating point moves toward the operating point B into the quadrant SF. Bias voltage Vpol is then increased to take the operating point back into tolerance area 37.

Figure 4:
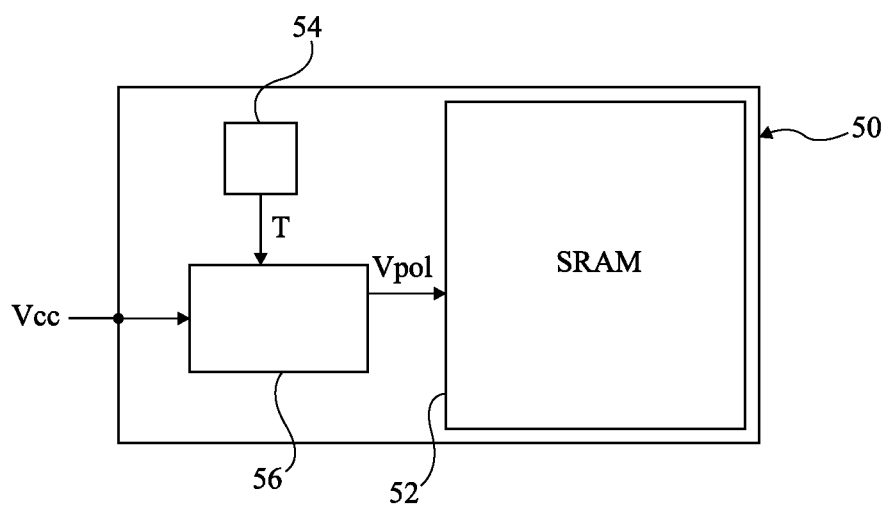
FIG. 4 is a simplified representation of an embodiment of an integrated circuit chip comprising an array of SRAM cells having transistors of the type in FIG. 2.

FIG. 4 shows a simplified example of an integrated circuit chip 50 comprising a single-well SRAM-type memory 52. According to an embodiment, chip 50 further comprises a temperature sensor 54 and a device 56 for controlling bias voltage Vpol of the single well. Control device 56 is powered with a voltage Vcc and delivers bias voltage Vpol to well 31 of SRAM 52. Bias voltage Vpol is determined by control device 56, for example, based on value T of the operating temperature of the single-well memory, T being delivered by temperature sensor 54.

Specific embodiments have been described. Various alterations and modifications will occur to those skilled in the art. In particular, although a single-well SRAM cell where transfer transistors 11 and 15 are N-channel MOS transistors has been described, the present description also applies to the case where these transistors are P-channel MOS transistors.

Although an embodiment of a method of minimizing the operating voltage of an SRAM memory formed above a P-type doped well 31 has been described, what has been described above applies to an N-type doped well 31.

Furthermore, the method of minimizing the consumption of an SRAM memory cell has been described above for equal target threshold voltages $VtP_A$ and $VtN_A$. This method also applies to target voltages $VtP_A$ and $VtN_A$ thresholds not being equal.

The method of minimizing the consumption of an SRAM memory cell has been described for a six transistors SRAM memory cell. This method can also be applied to SRAM memory cells having a different number of transistors.

The invention claimed is:

1. An integrated SRAM memory cell, comprising:
   a silicon on insulator substrate including a semiconductor layer, an insulating layer and a semiconductor support;
   an n-channel transistor having source, channel and drain regions formed in said semiconductor layer;
   a p-channel transistor having source, channel and drain regions for in said semiconductor layer;
   a doped well region in said semiconductor support located under said n- and p-channel transistors; and
   a circuit configured to apply a variable bias voltage to said doped well region, wherein said circuit is configured to:
      carry out measurements representative of a threshold voltage of the n-channel transistor and of a threshold voltage of the p-channel transistor; and
      adjust the variable bias voltage so that the threshold voltages of the n-channel transistor and of the p-channel transistor are substantially equal to n and p target threshold voltages, respectively.

2. The integrated SRAM memory cell of claim 1, wherein said circuit comprises:
   a temperature sensor configured to sense a temperature of said integrated SRAM memory cell; and
   a bias voltage generator configured to generate said variable bias voltage as a function of said sensed temperature.

3. The integrated SRAM memory cell of claim 2, wherein the bias voltage generator compares the sensed temperature to a reference temperature and controls the variable bias voltage in response to a difference between the sensed and reference temperatures so as to correct for increases of operating voltage resulting from a variation of said difference.

4. The integrated SRAM memory cell of claim 2, wherein the bias voltage generator is operable to increase the variable bias voltage when the sensed temperature decreases, and decreased the variable bias voltage when the sensed temperature increases.

5. The integrated SRAM memory cell of claim 1, wherein substantially equal means within 10% of the n and p target threshold voltages.

6. The integrated SRAM memory cell of claim 1, wherein the n and p target threshold voltages are equal to each other.

7. The integrated SRAM memory cell of claim 1, wherein the measurement representative of the threshold voltages comprises a measurement of a frequency of an oscillator formed of a chain of inverters.

8. The integrated SRAM memory cell of claim 7, wherein the chain of inverters are formed above said doped well located below said n-channel and p-channel transistors.

9. The integrated SRAM memory cell of claim 7, wherein the chain of inverters is formed from n-channel and p-channel transistors identical to the n-channel and p-channel transistors of said SRAM memory cell.

10. The integrated SRAM memory cell of claim 1, further comprising:
    logic circuitry formed in said semiconductor layer; and
    an additional doped well region in said semiconductor support located under said logic circuitry.

11. The integrated SRAM memory cell of claim 1, wherein the n-channel and p-channel transistors are formed above a same doped well.

12. A method of minimizing an operating voltage of an SRAM cell formed of FDSOI-type NMOS and PMOS transistors, wherein a doped well extends under an insulating layer below the FDSOI-type transistors, comprising:
    applying a bias voltage to the doped well,
    carrying out measurements representative of a threshold voltage of the NMOS transistors and of a threshold voltage of the PMOS transistors, and
    adjusting the bias voltage of the doped well according to a state of the memory cell so that the threshold voltage of the NMOS transistors and of the PMOS transistors are substantially equal to target threshold voltage of NMOS and PMOS transistors, respectively.

13. The method of claim 12, wherein the memory cell is an element of an array of identical memory cells, the doped well being shared in common to all the memory cells in the array.

14. The method of claim 12, wherein substantially equal means to within 10% of the target threshold voltage of NMOS and PMOS transistors.

15. The method of claim 12, wherein the target threshold voltage of NMOS and PMOS transistors are equal.

16. The method of claim 12, further comprising the successive steps of:
    measuring an operating temperature of the memory cell; and
    controlling the bias voltage in accordance with a difference between the operating temperature and a reference temperature so as to correct for increases of the operating voltage resulting from a variation of said difference.

17. The method of claim 16, wherein the well is P-type doped and the bias voltage is increased when the operating temperature decreases, and the bias voltage is decreased when the operating temperature increases.

18. The method of claim 12, wherein the measurement representative of the threshold voltages is a measurement of a frequency of an oscillator formed of a chain of inverters.

* * * * *